(12) United States Patent
Li et al.

(10) Patent No.: US 8,718,701 B2
(45) Date of Patent: May 6, 2014

(54) MOBILE WIRELESS COMMUNICATIONS DEVICE INCLUDING CONFORMABLE, SHAPE-RETAINING VACUUM FORMED FILM AND RELATED METHODS

(75) Inventors: Fan Li, Waterloo (CA); Tong Liu, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 43 days.

(21) Appl. No.: 13/355,161

(22) Filed: Jan. 20, 2012

(65) Prior Publication Data

US 2013/0190060 A1 Jul. 25, 2013

(51) Int. Cl.
*H04M 1/00* (2006.01)

(52) U.S. Cl.
USPC ............... 455/550.1; 455/575.1; 455/575.9

(58) Field of Classification Search
USPC ................. 455/575.1–575.9, 550.1
See application file for complete search history.

(56) References Cited

U.S. PATENT DOCUMENTS

| 4,858,075 | A | 8/1989 | Butterworth | 361/395 |
| 5,454,037 | A | 9/1995 | Pacella | 379/453 |
| 7,176,506 | B2 | 2/2007 | Beroz et al. | 257/232 |
| 7,876,274 | B2* | 1/2011 | Hobson et al. | 343/702 |
| 8,063,639 | B2 | 11/2011 | Zens | 324/321 |
| 2003/0193113 | A1 | 10/2003 | Glovatsky | |
| 2006/0046770 | A1* | 3/2006 | Zhu et al. | 455/550.1 |
| 2009/0093286 | A1* | 4/2009 | Zhu et al. | 455/575.5 |
| 2010/0020518 | A1 | 1/2010 | Bustamante | 361/818 |
| 2010/0234081 | A1* | 9/2010 | Wong et al. | 455/575.5 |
| 2011/0085316 | A1* | 4/2011 | Myers et al. | 361/818 |
| 2012/0069523 | A1* | 3/2012 | Kapusta et al. | 361/704 |

FOREIGN PATENT DOCUMENTS

| EP | 1499172 | 1/2005 |
| WO | 2008027888 | 3/2008 |

* cited by examiner

*Primary Examiner* — Lester Kincaid
*Assistant Examiner* — Dung Lam
(74) *Attorney, Agent, or Firm* — Allen, Dyer, Doppelt, Milbrath & Gilchrist, P.A.

(57) ABSTRACT

A mobile wireless communications device may include a portable housing, a printed circuit board (PCB) carried by the portable housing, and at least one electronic component carried by PCB and extending upwardly therefrom. The mobile wireless communications device may also include a conformable, shape-retaining film being vacuum formed onto the at least one electronic component and may include a peripheral edge secured to the PCB and a body portion conforming to the at least one electronic component.

15 Claims, 6 Drawing Sheets

MOBILE WIRELESS COMMUNICATIONS DEVICE INCLUDING CONFORMABLE, SHAPE-RETAINING VACUUM FORMED FILM AND RELATED METHODS

TECHNICAL FIELD

The present disclosure generally relates to the field of wireless communications systems, and, more particularly, to mobile wireless communications devices and related methods.

BACKGROUND

Mobile wireless communications systems continue to grow in popularity and have become an integral part of both personal and business communications. For example, cellular telephones allow users to place and receive voice calls almost anywhere they travel, while tablet personal computers allow mobile data communications almost anywhere. Moreover, as mobile communications technology, for example, cellular communications technology, has increased, so too has the functionality of cellular devices and the different types of devices available to users. For example, many cellular devices now incorporate personal digital assistant (PDA) features such as calendars, address books, task lists, etc. Moreover, such multi-function devices, including, for example, tablet personal computers, may also allow users to wirelessly send and receive electronic mail (email) messages and access the Internet via a cellular network and/or a wireless local area network (WLAN), for example.

Even so, as the functionality of cellular communications devices continues to increase, so too does the demand for smaller devices which are easier and more convenient for users to carry. One challenge this poses for cellular device manufacturers is designing housings that cooperate with antennas to provide desired operating characteristics within the relatively limited amount of space available.

DETAILED DESCRIPTION

The present description is made with reference to the accompanying drawings, in which various embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime notation is used to indicate similar elements or steps in alternative embodiments.

In accordance with one exemplary aspect, a mobile wireless communications device may include a portable housing, a printed circuit board (PCB) carried by the portable housing, and at least one electronic component carried by PCB and extending upwardly therefrom, for example. The mobile wireless communications device may also include a conformable, shape-retaining film being vacuum formed onto the at least one electronic component and comprising a peripheral edge secured to the PCB and a body portion conforming to the at least one electronic component.

The conformable, shape-retaining film may include an electrically conductive layer to provide Radio Frequency (RF) shielding. The electrically conductive layer may include aluminum. The conformable, shape-retaining film may further include a dielectric layer adjacent the electrically conductive layer.

The mobile wireless communications device may further include a frame coupled to the PCB around the circuitry and secured to the peripheral edge of the conformable, shape-retaining film, for example. The mobile wireless communications device may further include an adhesive material layer carried by the at least one electronic component. The conformable, shape-retaining film may have a vacuum port opening therein adjacent the adhesive material layer.

The mobile wireless communications device may further include at least one other electronic component beneath the shape-retaining film, for example. The mobile wireless communications device may further include a wireless transceiver carried by the PCB. An antenna may be coupled to the wireless transceiver, for example.

The at least one electronic component may include at least one integrated circuit (IC). The at least one electronic component may include a processor, for example.

Another exemplary aspect is directed to a shield frame assembly. A method aspect is directed to a method of making a mobile wireless communications device including a portable housing, a printed circuit board (PCB) carried by the portable housing, and at least one electronic component carried by the PCB and extending upwardly therefrom. The method may include vacuum forming a conformable, shape-retaining film onto the at least one electronic component. The conformable, shape-retaining film may have a peripheral edge secured to the PCB, and a body portion conforming to the at least one electronic component.

Figure 1:
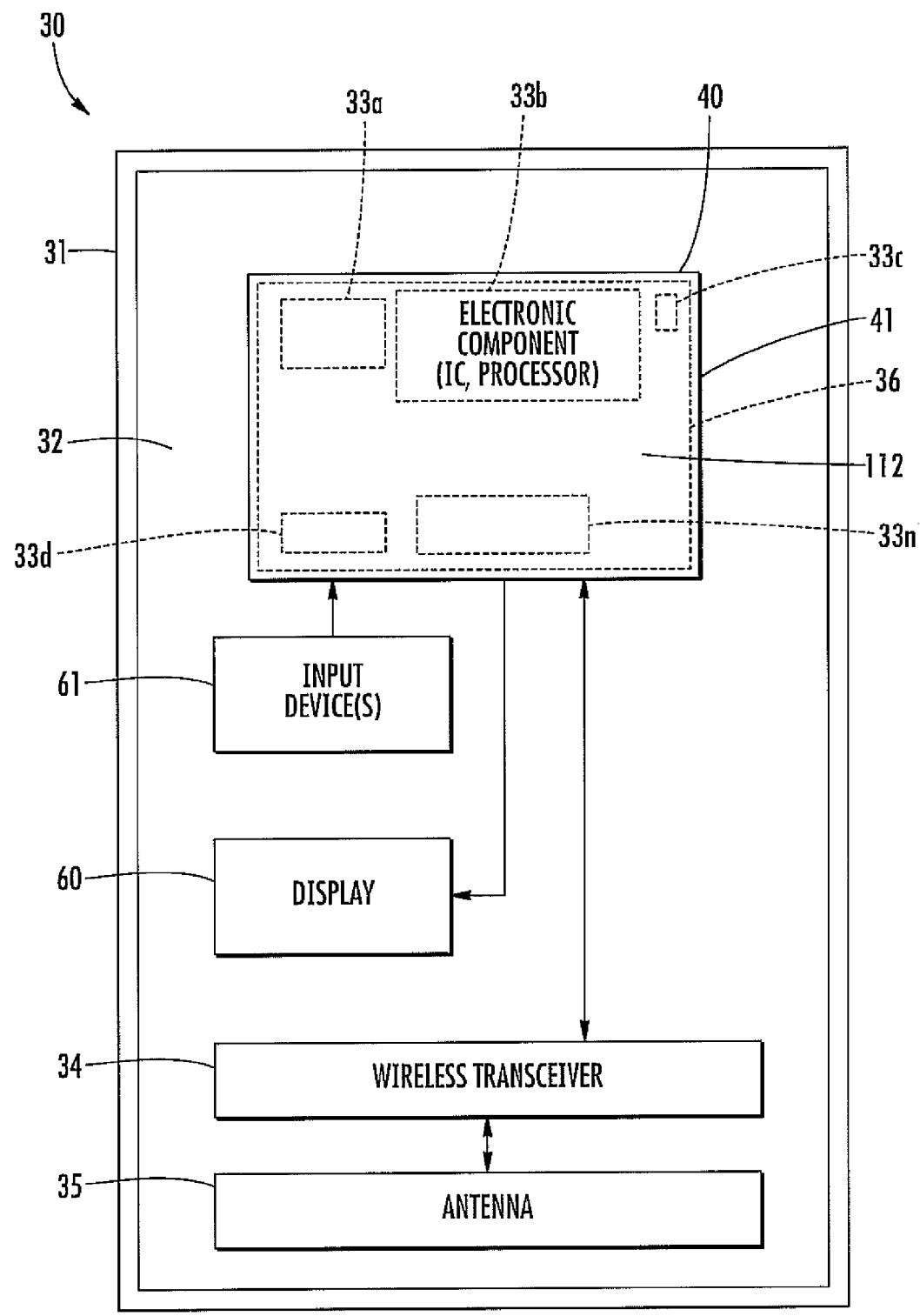
FIG. 1 is a schematic block diagram of a mobile wireless communications device including a conformable, shape-retaining film in accordance with one example embodiment.
Figure 2:
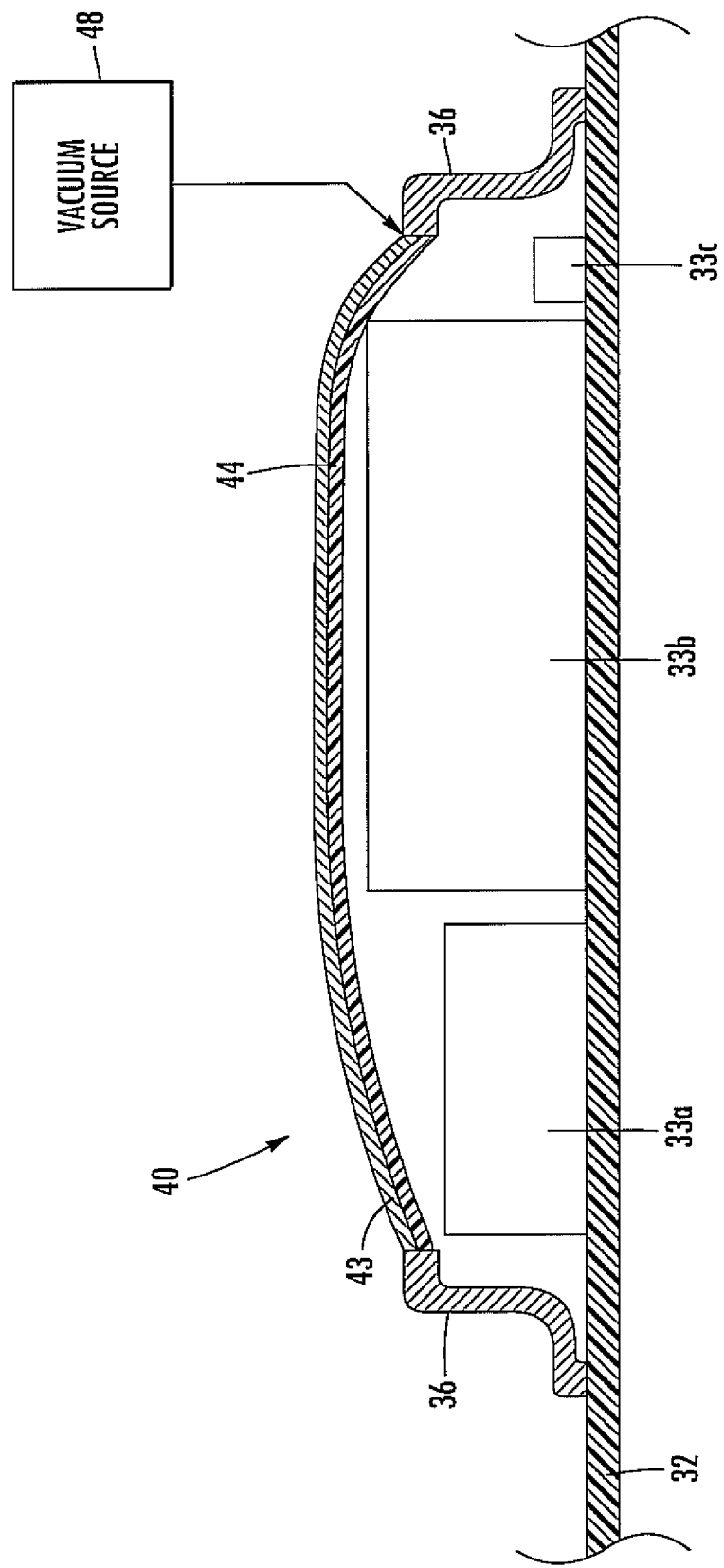
FIG. 2 is a cross-sectional view of a portion of the PCB of FIG. 1 including the conformable, shape-retaining film prior to being vacuum formed.
Figure 3:
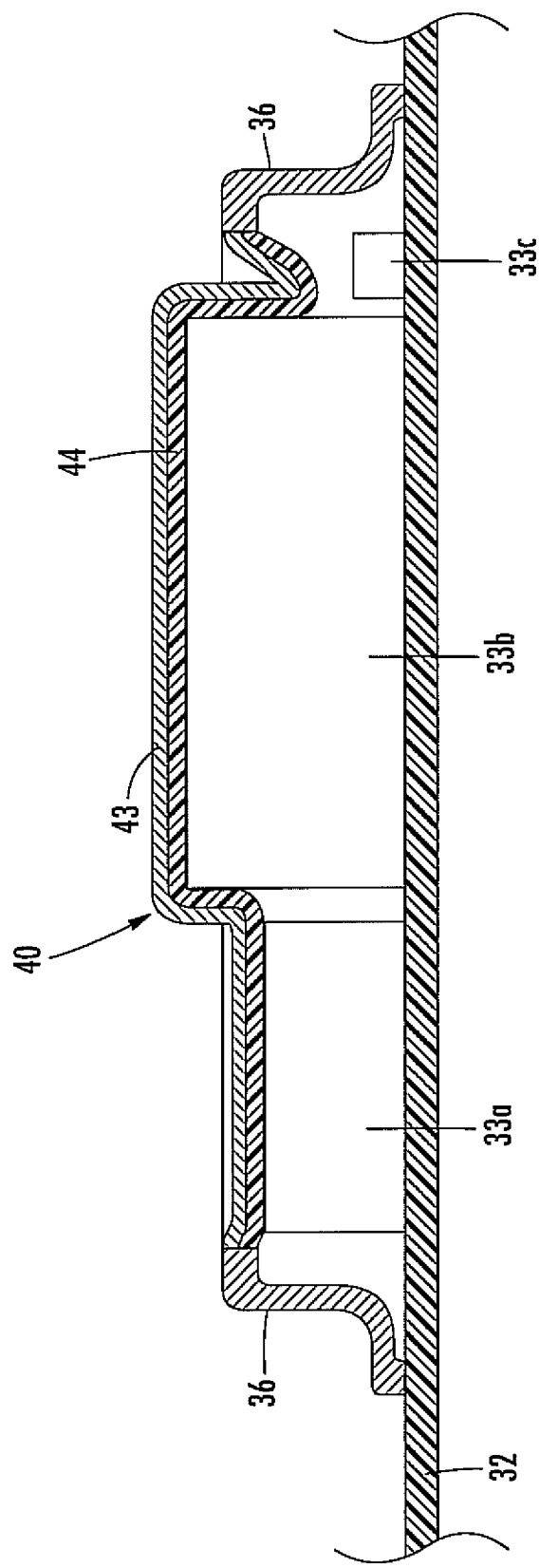
FIG. 3 is a cross-sectional view of the portion of the PCB of FIG. 2 including the conformable, shape-retaining film after being vacuum formed.

Referring now to FIGS. 1-3, a mobile wireless communications device 30 illustratively includes a portable housing 31 a printed circuit board (PCB) 32, carried by the portable housing. The PCB 32 may also include a conductive layer defining a ground plane.

The exemplary device 30 further illustratively includes a display 60 and one or more input devices 61. The input devices 61 may be in the form of a plurality of control keys including an "off hook" (i.e., initiate phone call) key, an "on hook" (i.e., discontinue phone call) key, a menu key, and a return or escape key. Operation of the various device components and input keys, etc., will be described further below with reference to FIG. 6.

The mobile wireless communications device 30 also includes electronic components 33a-33n carried by the PCB 32 that extend updwardly therefrom. The electronic components 33a-33n may include an integrated circuit, for example, a processor, or a memory. Other circuitry, for example, discrete components, associated with the mobile wireless communications device 30 may also be carried by the PCB 32.

The mobile wireless communications device 30 also includes a wireless transceiver 34 and an antenna 35 coupled to the wireless transceiver. The wireless transceiver 34 may be configured to perform a wireless communications function, for example, wireless voice or data communications. The wireless transceiver 34 may be a cellular transceiver, for example.

The mobile wireless communications device 30 illustratively includes a frame 36 coupled to the PCB 32 around the electronic components 33a-33n. The frame 36 may be metallic, for example, steel, aluminum, or other metal, as will be appreciated by those skilled in the art. In some embodiments, the frame 36 may include a pick-up tab that extends across the frame. The pick-up tab may used by assembly line machinery, for example, a vacuum, to pick-up the frame and place it on the PCB 32. The pick-up tab may be removable after assembly, or may remain for additional support.

The mobile wireless communications device 30 also includes a conformable, shape-retaining film 40 that is positioned over the electronic components 33a-33n. The conformable, shape-retaining film 40 retains its given shape, i.e., it is not elastic. The conformable, shape-retaining film 40 includes a peripheral edge 41 and a body portion 42 and includes two layers (FIGS. 2 and 3). The conformable, shape-retaining film 40 is positioned so that the peripheral edge 41 generally aligns with the frame 36 (FIG. 2).

More particularly, the conformable, shape-retaining film 40 includes an electrically conductive layer 43 that may advantageously provide radio frequency (RF) shielding, for example. The electrically conductive layer 43 may be aluminum, for example. Of course, the electrically conductive layer 43 may be another electrically conductive material.

The conformable, shape-retaining film 40 also illustratively includes a dielectric layer 44 adjacent the electrically conductive layer 43. The dielectric layer 44 may be an inner layer with respect to the electrically conductive layer 43 such that it may physically contact one of the electronic components 33b. The dielectric layer 44 may be a thermally conductive material, for example, graphite or a plastic, to increase thermal dissipation from the electronic components 33a-33n. Of course, the dielectric layer 44 may be another thermally conductive material, or include one or more thermally conductive materials. The conformable, shape-retaining film 40 may include other or additional layers, as will be appreciated by those skilled in the art.

The conformable, shape-retaining film 40 is vacuum formed onto the electronic components 33a-33n to conform thereto (FIG. 3). More particularly, the conformable, shape-retaining film 40 may be vacuum formed by securing a portion of the peripheral edge 41 of the conformable, shape-retaining film 40 to the frame 36, and then applying a vacuum at another portion of the peripheral edge using a vacuum source 48 as would be appreciated by those skilled in the art. The application of the vacuum causes the conformable, shape-retaining film 40 to advantageously conform to the electronic components 33a-33n and retain this conforming shape (FIG. 3). Other techniques and arrangements for coupling the conformable, shape-retaining film 40 to the frame 36 and applying a vacuum from the vacuum source 48 may be used as will be appreciated by those skilled in the art.

In some embodiments, the peripheral edge 41 may be directly coupled to the frame 36. For example, the frame 36 may include a surface feature to facilitate coupling with peripheral edge 41 of the conformable, shape-retaining film 40. Other features or techniques may be used to facilitate coupling of the frame 36 to the peripheral edge 41, as will be appreciated by those skilled in the art.

In other embodiments, the frame 36 may be a two-part frame. A first frame part may be coupled to the conformable, shape-retaining film 40, while a second frame part is coupled to the PCB 32 around the electronic components 33a-33n as noted above.

Figure 4:
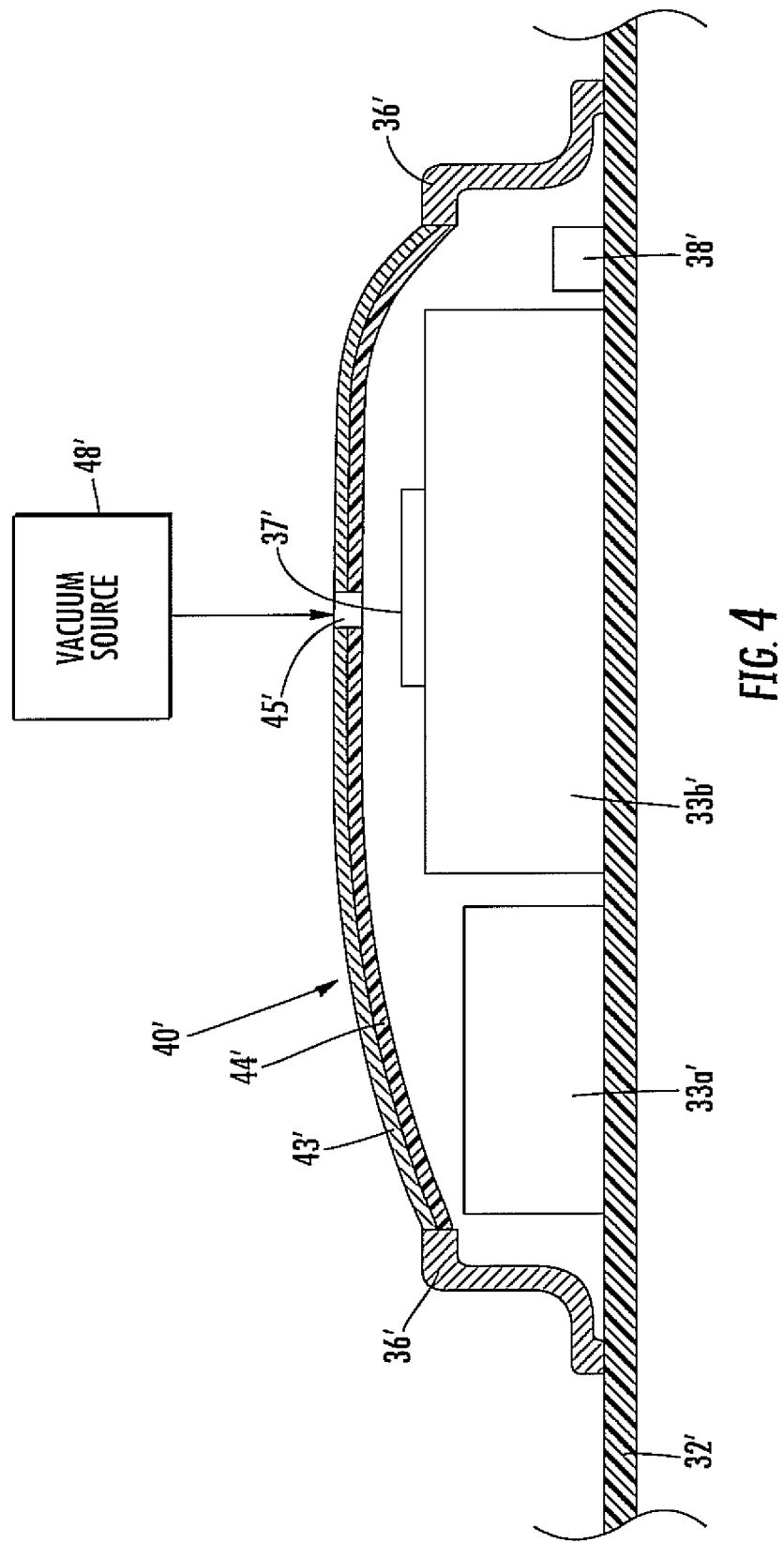
FIG. 4 is a cross-sectional view of a portion of the PCB including the conformable, shape-retaining film prior to being vacuum formed according to another embodiment.
Figure 5:
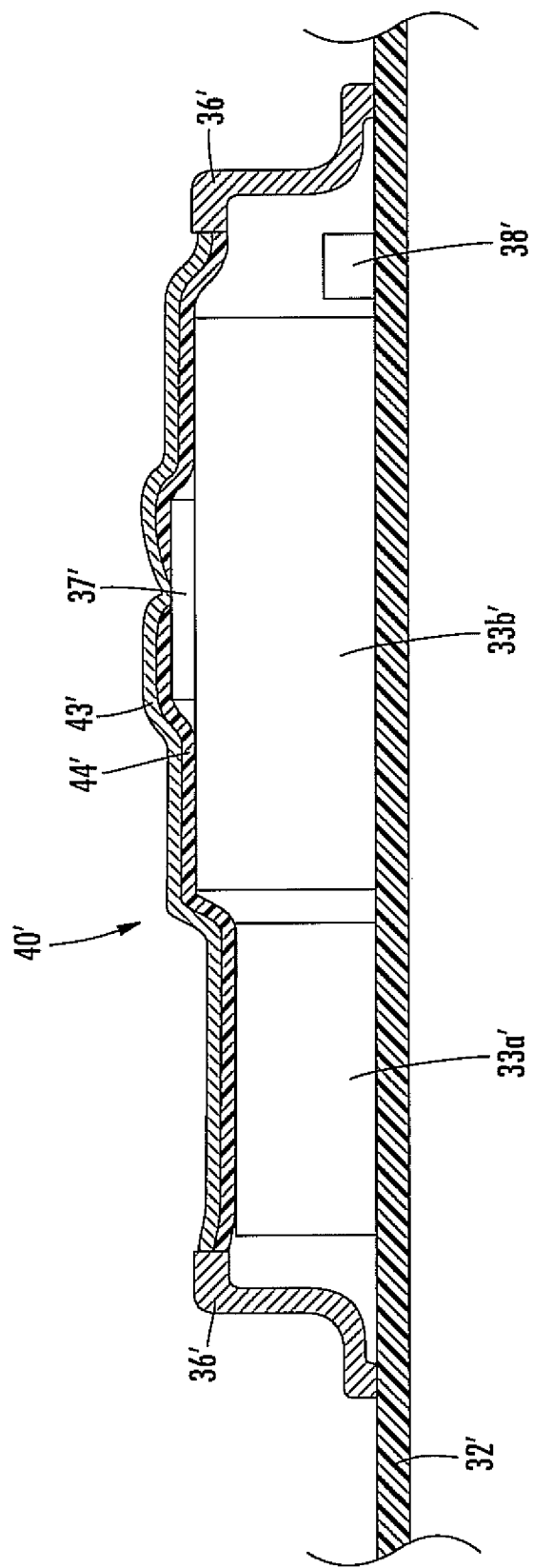
FIG. 5 is a cross-sectional view of the portion of the PCB of FIG. 4 including the conformable, shape-retaining film after being vacuum formed.

Referring now to FIGS. 4 and 5, in another embodiment, an adhesive material layer 37' may be carried by one of the electronic components 33b'. In particular, the adhesive layer 37' may be carried by the electronic component that extends the most upwardly from the PCB 32', i.e., the tallest electronic component.

The conformable, shape-retaining film 40' illustratively has a vacuum port opening 45' therein adjacent the adhesive material layer 37'. The conformable, shape-retaining film 40' is positioned over the electronic components 33a'-33n' with the peripheral edge 41' aligned with the frame 36'. A vacuum is applied at the vacuum port opening 45' from the vacuum source 48' so that the conformable, shape-retaining film 40' conforms to the electronic components 33a'-33n'. The vacuum causes the edges of the conformable, shape-retaining film 40' at the vacuum port opening 45' to contact the adhesive material layer 37' and thus seal or close the vacuum port opening.

Additionally, as will be appreciated by those skilled in the art, another electronic component 38' may be carried by the PCB 32' underneath the conformable, shape-retaining film 40'. In other words, the body portion 42' of the conformable, shape-retaining film 40' may not conform to another electronic component 38', such as one lower in height. More than one other electronic component may be carried underneath the conformable, shape-retaining film 40' so that the body portion 42' does not contact or conform thereto.

The conformable, shape-retaining film 40 advantageously may operate similar to a heat sink, for example, to facilitate removal of heat from a processor, for example. As will be appreciated by those skilled in the art, the processor may generate an increased amount of heat compared to other electronic components. Moreover, the conformable, shape-retaining film 40 may also provide increased RF shielding of the electronic components 33a-33n from other circuitry, for example, the wireless transceiver 34 and the antenna 35.

Additionally, as will be appreciated by those skilled in the art, a conventional rigid RF shield, for example, may extend relatively high from the PCB and thus contribute to an increased overall thickness of the mobile wireless communications device. By being vacuum formed to conform to the electronic components 33a-33n, the conformable, shape-retaining film 40 may allow the overall height or thickness of the mobile wireless communications device 30 may be reduced. In other words, an amount of space between the electronic components and the RF shield is reduced.

Additionally, the conformable, shape-retaining film 40 may also increasingly dissipate heat from the electronic components 33a-33n. For example, a higher speed processor generally requires a more sufficient way to dissipate heat from the processor. The direct contact of the processor to the conformable, shape-retaining film 40 improves heat dissipation compared to air or a thermal gel filled space between a rigid shield and a processor, for example. The dielectric layer 44 and the electrically conductive layer 43, as an RF shield, more efficiently, transfer an increased amount of heat generated by the processor to the surrounding area and the ground, as will be appreciated by those skilled in the art.

A method aspect is directed to a method of making a mobile wireless communications device 30 including a portable housing 31, a printed circuit board 32 (PCB) carried by the portable housing, and at least one electronic component 33a-33n carried by the PCB and extending upwardly therefrom. The method includes vacuum forming a conformable, shape-retaining film 40 onto the at least one electronic component 33a-33n. The conformable, shape-retaining film 40 has a peripheral edge 41 secured to the PCB 32 and a body portion 42 conforming to the at least one electronic component 33a-33n.

Example components of a mobile wireless communications device 1000 that may be used in accordance with the above-described embodiments are further described below with reference to FIG. 6. The device 1000 illustratively includes a housing 1200, a keyboard or keypad 1400 and an output device 1600. The output device shown is a display 1600, which may comprise a full graphic LCD. Other types of output devices may alternatively be utilized. A processing device 1800 is contained within the housing 1200 and is coupled between the keypad 1400 and the display 1600. The processing device 1800 controls the operation of the display 1600, as well as the overall operation of the mobile device 1000, in response to actuation of keys on the keypad 1400.

The housing 1200 may be elongated vertically, or may take on other sizes and shapes (including clamshell housing structures). The keypad may include a mode selection key, or other hardware or software for switching between text entry and telephony entry.

Figure 6:
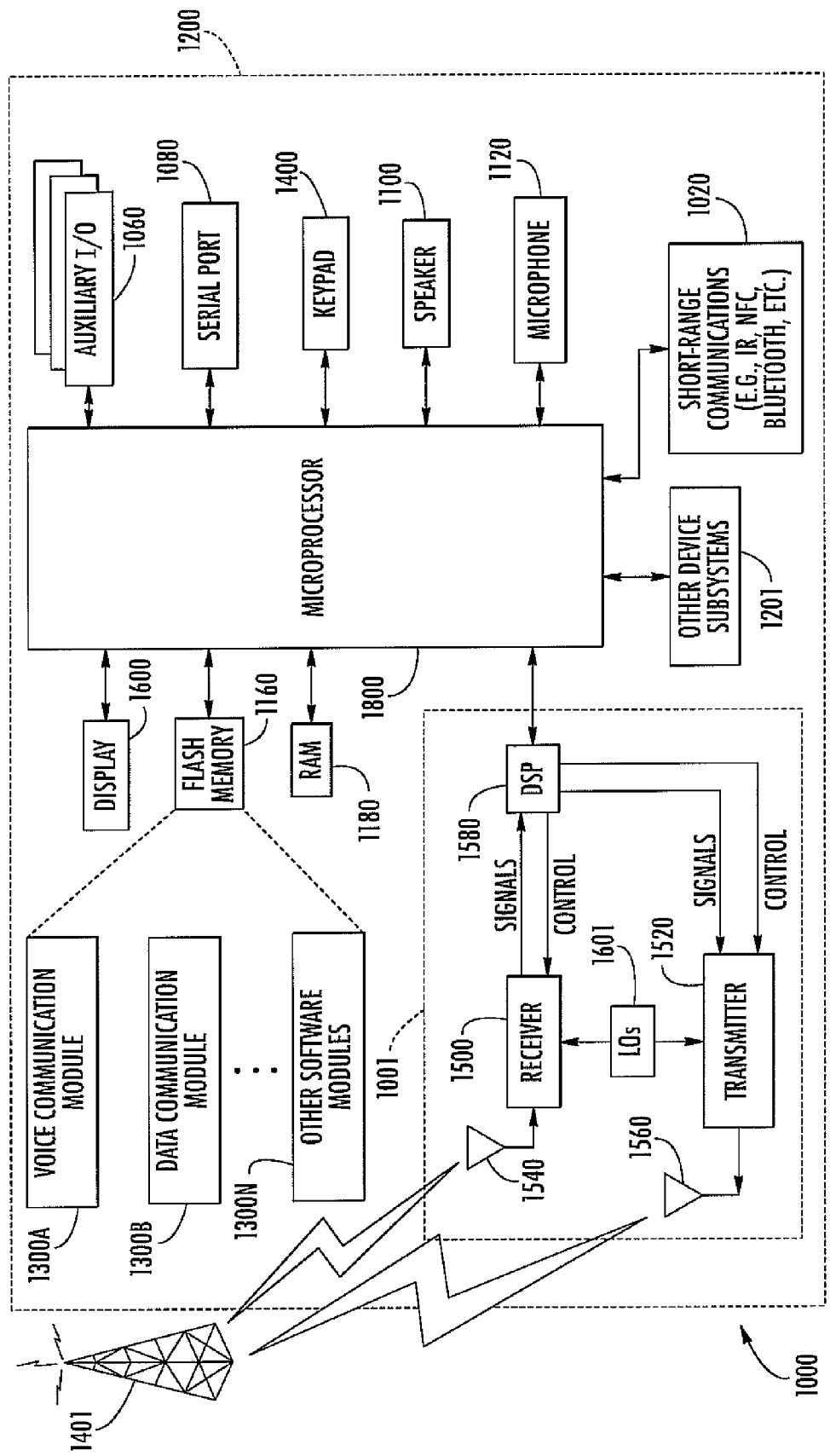
FIG. 6 is schematic block diagram illustrating additional components that may be included in the mobile wireless communications device of FIG. 1.

In addition to the processing device 1800, other parts of the mobile device 1000 are shown schematically in FIG. 6. These include a communications subsystem 1001; a short-range communications subsystem 1020; the keypad 1400 and the display 1600, along with other input/output devices 1060, 1080, 1100 and 1120; as well as memory devices 1160, 1180 and various other device subsystems 1201. The mobile device 1000 may comprise a two-way RF communications device having data and, optionally, voice communications capabilities. In addition, the mobile device 1000 may have the capability to communicate with other computer systems via the Internet.

Operating system software executed by the processing device 1800 is stored in a persistent store, such as the flash memory 1160, but may be stored in other types of memory devices, such as a read only memory (ROM) or similar storage element. In addition, system software, specific device applications, or parts thereof, may be temporarily loaded into a volatile store, such as the random access memory (RAM) 1180. Communications signals received by the mobile device may also be stored in the RAM 1180.

The processing device 1800, in addition to its operating system functions, enables execution of software applications 1300A-1300N on the device 1000. A predetermined set of applications that control basic device operations, such as data and voice communications 1300A and 1300B, may be installed on the device 1000 during manufacture. In addition, a personal information manager (PIM) application may be installed during manufacture. The PIM may be capable of organizing and managing data items, such as e-mail, calendar events, voice mails, appointments, and task items. The PIM application may also be capable of sending and receiving data items via a wireless network 1401. The PIM data items may be seamlessly integrated, synchronized and updated via the wireless network 1401 with corresponding data items stored or associated with a host computer system.

Communication functions, including data and voice communications, are performed through the communications subsystem 1001, and possibly through the short-range communications subsystem. The communications subsystem 1001 includes a receiver 1500, a transmitter 1520, and one or more antennas 1540 and 1560. In addition, the communications subsystem 1001 also includes a processing module, such as a digital signal processor (DSP) 1580, and local oscillators (LOs) 1601. The specific design and implementation of the communications subsystem 1001 is dependent upon the communications network in which the mobile device 1000 is intended to operate. For example, a mobile device 1000 may include a communications subsystem 1001 designed to operate with the Mobitexυ, Data TAC™ or General Packet Radio Service (GPRS) mobile data communications networks, and also designed to operate with any of a variety of voice communications networks, such as AMPS, TDMA, CDMA, WCDMA, PCS, GSM, EDGE, etc. Other types of data and voice networks, both separate and integrated, may also be utilized with the mobile device 1000. The mobile device 1000 may also be compliant with other communications standards such as 3GSM, 3GPP, UMTS, 4G, etc.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore typically involves use of a subscriber identity module, commonly referred to as a SIM card, in order to operate on a GPRS network.

When required network registration or activation procedures have been completed, the mobile device 1000 may send and receive communications signals over the communication network 1401. Signals received from the communications network 1401 by the antenna 1540 are routed to the receiver 1500, which provides for signal amplification, frequency down conversion, filtering, channel selection, etc., and may also provide analog to digital conversion. Analog-to-digital conversion of the received signal allows the DSP 1580 to perform more complex communications functions, such as demodulation and decoding. In a similar manner, signals to be transmitted to the network 1401 are processed (e.g. modulated and encoded) by the DSP 1580 and are then provided to the transmitter 1520 for digital to analog conversion, frequency up conversion, filtering, amplification and transmission to the communication network 1401 (or networks) via the antenna 1560.

In addition to processing communications signals, the DSP 1580 provides for control of the receiver 1500 and the transmitter 1520. For example, gains applied to communications signals in the receiver 1500 and transmitter 1520 may be adaptively controlled through automatic gain control algorithms implemented in the DSP 1580.

In a data communications mode, a received signal, such as a text message or web page download, is processed by the communications subsystem 1001 and is input to the processing device 1800. The received signal is then further processed by the processing device 1800 for an output to the display 1600, or alternatively to some other auxiliary I/O device 1060. A device may also be used to compose data items, such as e-mail messages, using the keypad 1400 and/or some other auxiliary I/O device 1060, such as a touchpad, a rocker switch, a thumb-wheel, or some other type of input device. The composed data items may then be transmitted over the communications network 1401 via the communications subsystem 1001.

In a voice communications mode, overall operation of the device is substantially similar to the data communications mode, except that received signals are output to a speaker 1100, and signals for transmission are generated by a microphone 1120. Alternative voice or audio I/O subsystems, such as a voice message recording subsystem, may also be implemented on the device 1000. In addition, the display 1600 may also be utilized in voice communications mode, for example to display the identity of a calling party, the duration of a voice call, or other voice call related information.

The short-range communications subsystem enables communication between the mobile device 1000 and other proximate systems or devices, which need not necessarily be similar devices. For example, the short-range communications subsystem may include an infrared device and associated circuits and components, a Bluetooth™ communications module to provide for communication with similarly-enabled systems and devices, or a near field communications (NFC) sensor for communicating with a NFC device or NFC tag via NFC communications.

any modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A mobile wireless communications device comprising:
    a portable housing;
    a printed circuit board (PCB) carried by said portable housing;
    at least one electronic component carried by said PCB and extending upwardly therefrom; and
    an adhesive material layer carried by said at least one electronic component;
    a rigid metallic frame coupled to said PCB around said circuitry; and
    a conformable, shape-retaining film comprising
        a peripheral edge configured to be secured to said rigid metallic frame,
        a body portion configured to conform to said at least one electronic component, and
        a vacuum port opening adjacent said adhesive material layer,
        the vacuum port opening being configured to be vacuumed by a vacuum source so that the peripheral edge conforms to said at least one electronic component,
        the vacuum port opening being configured to be sealed by contacting the adhesive material layer in response to being vacuumed.

2. The mobile wireless communications device of claim 1, wherein said conformable, shape-retaining film comprises an electrically conductive layer to provide Radio Frequency (RF) shielding.

3. The mobile wireless communications device of claim 2, wherein said electrically conductive layer comprises aluminum.

4. The mobile wireless communications device of claim 2, wherein said conformable, shape-retaining film further comprises a dielectric layer adjacent said electrically conductive layer.

5. The mobile wireless communications device of claim 1, further comprising at least one other electronic component beneath said shape-retaining film.

6. The mobile wireless communications device of claim 1, further comprising:
    a wireless transceiver carried by said PCB; and
    an antenna coupled to said wireless transceiver.

7. The mobile wireless communications device of claim 1, wherein said at least one electronic component comprises at least one integrated circuit (IC).

8. The mobile wireless communications device of claim 1, wherein said at least one electronic component comprises a processor.

9. A shielding frame assembly to be coupled to a printed circuit board (PCB) carried by a housing of a mobile wireless communications device comprising at least one electronic component carried by the PCB and extending upwardly therefrom, and an adhesive material layer carried by said at least one electronic component, the shielding frame assembly comprising:
    a rigid metallic frame to be coupled to the PCB around the at least one electronic component; and
    a conformable, shape-retaining film comprising:
        an electrically conductive layer configured to provide radio frequency (RF) shielding,
        a peripheral edge configured to be secured to said rigid metallic frame,
        a body portion configured to conform to the at least one electronic component, and
        a vacuum port opening adjacent the adhesive material layer,
        the vacuum port opening being configured to be vacuumed by a vacuum source so that the peripheral edge conforms to the at least one electronic component,
        the vacuum port opening being configured to be sealed by contacting the adhesive material layer in response to being vacuumed.

10. The shielding frame assembly of claim 9, wherein said electrically conductive layer comprises aluminum.

11. The shielding frame assembly of claim 9, wherein said conformable, shape-retaining film further comprises a dielectric inner layer adjacent said electrically conductive layer.

12. A method of making a mobile wireless communications device comprising a portable housing, a printed circuit board (PCB) carried by the portable housing, at least one electronic component carried by the PCB and extending upwardly therefrom, and an adhesive material layer carried by the at least one electronic component, the method comprising:
    coupling a rigid metallic frame to the PCB around the at least one electronic component;
    securing a peripheral edge of a conformable, shape-retaining film to the rigid metallic frame;
    positioning a vacuum port opening of the conformable, shape-retaining film adjacent the adhesive material layer; and
    vacuuming the vacuum port opening using a vacuum source so that the peripheral edge conforms to the at least one electronic component, and so that the vacuum port opening is sealed by contacting the adhesive material layer.

13. The method of claim 12, wherein the conformable, shape-retaining film comprises an electrically conductive layer to provide Radio Frequency (RF) shielding.

14. The method of claim 13, wherein the electrically conductive layer comprises aluminum.

15. The method of claim 13, wherein the conformable, shape-retaining film further comprises a dielectric layer adjacent the electrically conductive layer.

* * * * *